United States Patent [19]

Redington

[11] Patent Number: 4,581,582

[45] Date of Patent: Apr. 8, 1986

[54] HIGH-SPATIAL-RESOLUTION SPECTROSCOPIC NMR IMAGING OF CHEMICALLY-SHIFTED NUCLEI

[75] Inventor: Rowland W. Redington, Schenectady, N.Y.

[73] Assignee: General Electric Company, Schenectady, N.Y.

[21] Appl. No.: 565,305

[22] Filed: Dec. 27, 1983

[51] Int. Cl.⁴ .............................................. G01R 33/20
[52] U.S. Cl. ..................................... 324/309; 324/308
[58] Field of Search ............... 324/300, 308, 309, 310, 324/313, 311, 312; 128/653

[56] References Cited

U.S. PATENT DOCUMENTS

| | | | |
|---|---|---|---|
| 3,239,752 | 3/1966 | Greenwood | 324/308 |
| 4,345,207 | 8/1982 | Bertrand | 324/308 |
| 4,361,807 | 11/1982 | Burl et al. | 324/309 |

Primary Examiner—Michael J. Tokar
Attorney, Agent, or Firm—Geoffrey H. Krauss; James C. Davis, Jr.; Marvin Snyder

[57] ABSTRACT

A method for providing a high-spatial-resolution NMR image, having resolved artifact-free NMR images of chemically-shifted nuclei, includes: forming independent NMR images having imaging components due to each of the chemically-shifted nuclei; registering and combining the images to eliminate one of the components and produce a composite image containing the other component and a negative of the other component offset by the chemical shift; and forming a resolved image of the component by processing the composite image to eliminate the negative: The resolved image may then be combined with one or more of the NMR images to produce a resolved image of the first component. The method requires only 2N projections to form the two independent N-by-N NMR images.

20 Claims, 7 Drawing Figures

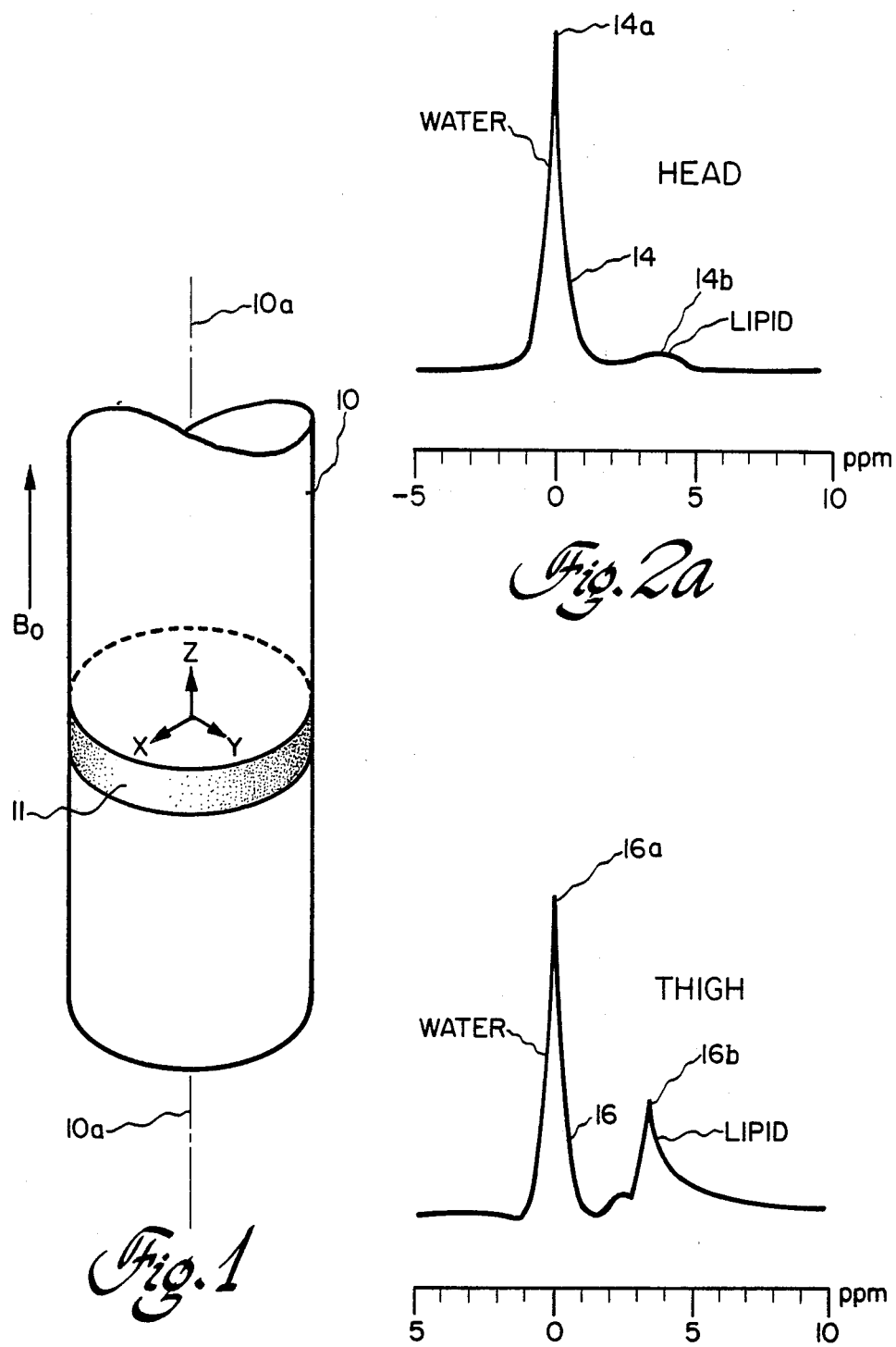

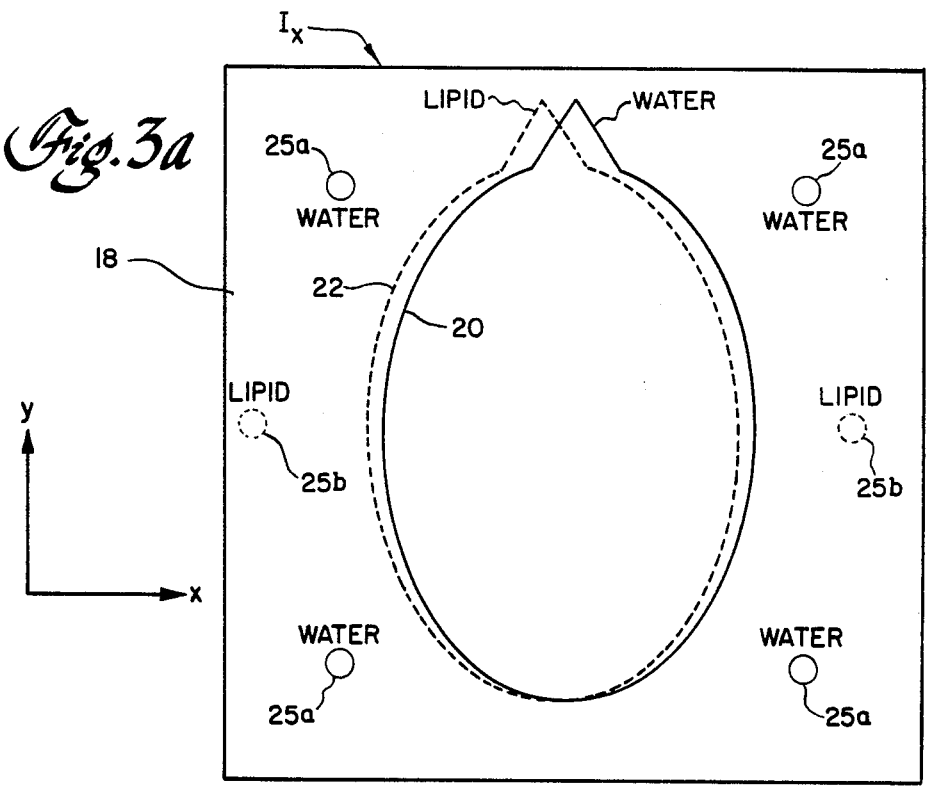
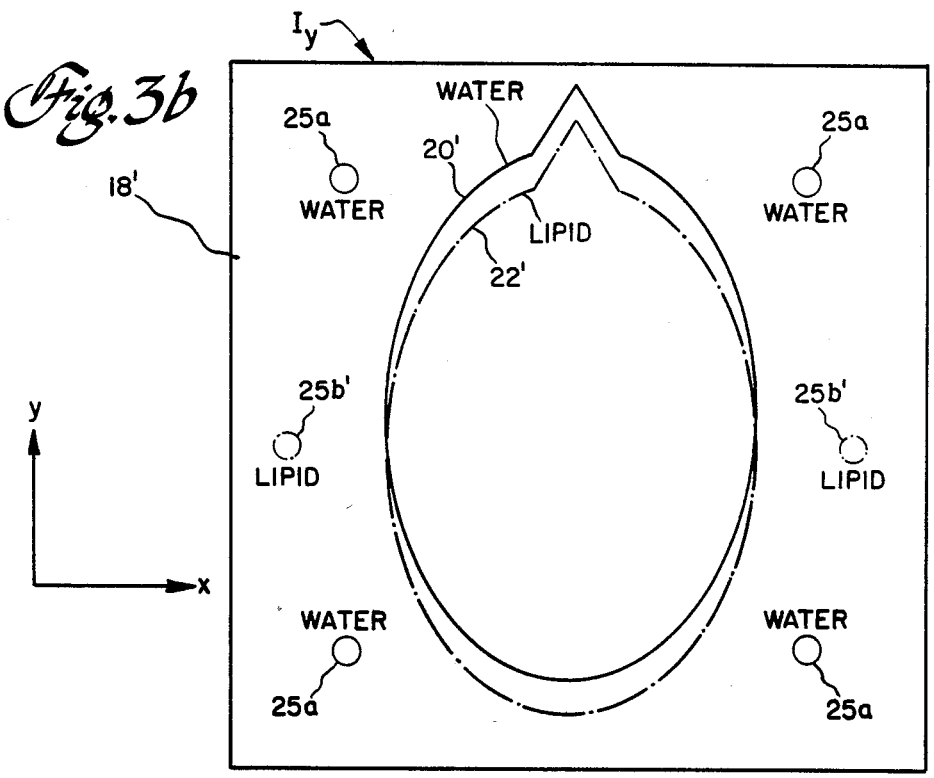

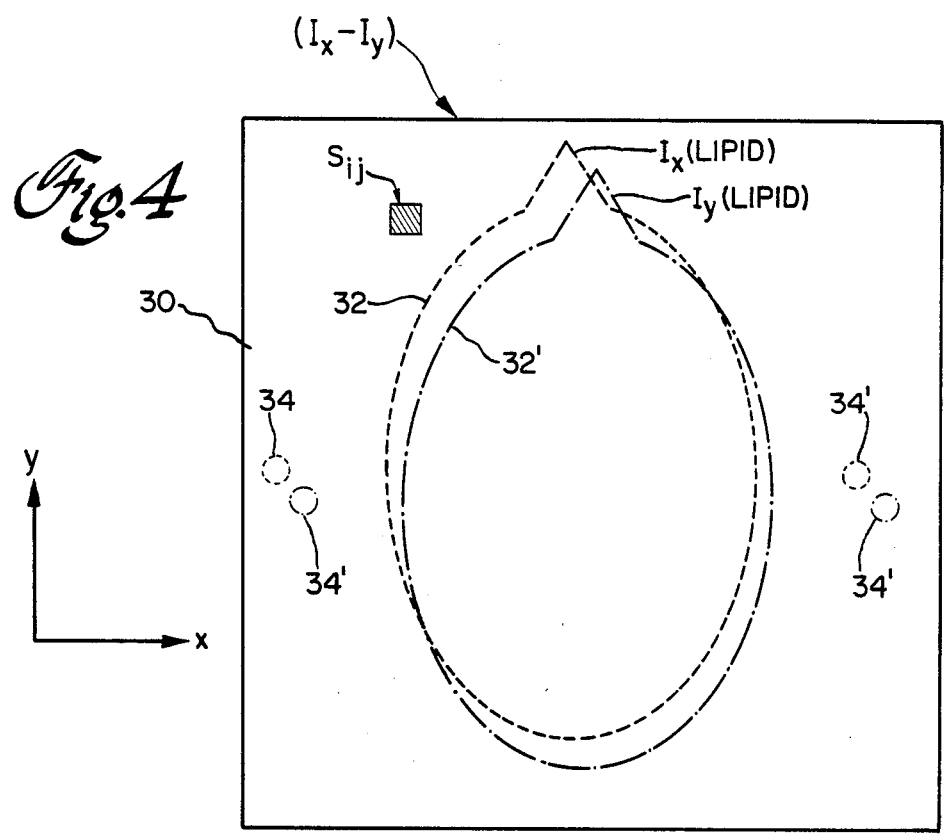

Fig. 5

|  | j=1 | j=2 | j=3 | j=4 | j=5 | j=6 |
|---|---|---|---|---|---|---|
| i=1 | $L_{11}=S_{11}$ | $L_{12}=S_{12}$ | $L_{13}=S_{13}$ | $L_{14}=S_{14}$ | $L_{15}=S_{15}$ | $L_{16}=S_{16}$ |
| i=2 | $L_{21}=S_{21}$ | $L_{22}=$ $S_{22}+L_{11}$ | $L_{23}=$ $S_{23}+L_{12}$ | $L_{24}=$ $S_{24}+L_{13}$ | $L_{25}=$ $S_{25}+L_{14}$ | $L_{26}=$ $S_{26}+L_{15}$ |
| i=3 | $L_{31}=S_{31}$ | $L_{32}=$ $S_{32}+L_{21}$ | $L_{33}=$ $S_{33}+L_{22}$ | $L_{34}=$ $S_{34}+L_{23}$ | $L_{35}=$ $S_{35}+L_{24}$ | $L_{36}=$ $S_{36}+L_{25}$ |
| i=4 | $L_{41}=S_{41}$ | $L_{42}=$ $S_{42}+L_{31}$ | $L_{43}=$ $S_{43}+L_{32}$ | $L_{44}=$ $S_{44}+L_{33}$ | $L_{ij}=S_{ij}+L_{i-\delta,i-\delta}$ | |
| i=5 | $L_{51}=S_{51}$ | $L_{52}=$ $S_{52}+L_{41}$ | $L_{53}=$ $S_{53}+L_{42}$ | $L_{54}=$ $S_{54}+L_{43}$ | | |
| i=6 | $L_{61}=S_{61}$ | $L_{62}=$ $S_{62}+L_{51}$ | $L_{63}=$ $S_{63}+L_{52}$ | $L_{64}=$ $S_{64}+L_{53}$ | | |

HIGH-SPATIAL-RESOLUTION SPECTROSCOPIC NMR IMAGING OF CHEMICALLY-SHIFTED NUCLEI

BACKGROUND OF THE INVENTION

The invention relates to nuclear magnetic resonance (NMR) imaging and, more particularly, to methods enabling high-spatial-resolution spectroscopic NMR imaging with selected muclei of a sample containing nuclei having chemically-shifted NMR frequencies.

As is well known, the nuclear magnetic resonance phenomenon is exhibited by atomic nuclei with an odd number of either protons or neutrons. Such nuclei possess spin, which endows them with a small magnetic field. When placed in an externally applied static main magnetic field $B_o$, the nuclei tend to align themselves with the applied field and produce a net magnetization M in the direction of the applied field. The nuclei oscillate, or precess, about the axis of the applied field with a characteristic NMR frequency, $\omega_o$, given by the Larmor equation:

$$\omega_o = \gamma B_o \tag{1}$$

where $\gamma$ is the gyromagnetic ratio and is constant for each NMR isotope. The NMR precession frequency is directly proportional to the applied field $B_o$. If a time-dependent (RF) magnetic field, having a frequency component equal to the Larmor frequency of the nuclei, is applied in a direction orthogonal to the main field, then the nuclei will absorb energy and nutate away from the axis of the main field and commence to precess at the Larmor frequency about the new net applied field direction. When the RF field is turned off, the nuclei emit NMR signals at their characteristic Larmor frequency, which signals decay as the nuclei relax or return to equilibrium in alignment with the main field. These NMR signals may be detected and Fourier transformed to derive the frequency components of the NMR signals which are characteristic of the nuclei.

Nuclei of the same isotope can exhibit minute variations in their NMR frequencies, which are referred to as chemical shifts, because of differences in their chemical environments which cause differences in their magnetic field environments. Chemical shifts result from alterations of the magnetic field around nuclei as a result of the shielding currents that are associated with the distribution of electrons around adjacent atoms. The degree of shielding is characteristic of the environment of the nucleus, and thus the chemical shift spectrum of a given molecule is unique and can be used for identification. In conventional NMR spectroscopy, the chemical structure of the sample is studied by observing the chemically-shifted signals returned from an NMR experiment. Because the resonant frequency and the absolute chemical shift are dependent upon the strength of the field, the chemical shift is expressed as a fractional shift in parts-per-million (ppm) of the resonant frequency relative to an arbitrary reference compound.

Since the Larmor frequency is porportional to the magnetic field, if the magnetic field varies spatially in a sample, then so does the resonant frequency of the nuclei. In NMR imaging, one or more magnetic field gradients are applied to the sample to spatially encode the emitted NMR signals. By applying an RF excitation pulse (having a narrow range of frequency components) to the sample in the presence of gradients, the nuclei in a selected region, e.g., a planar slice, or at a selected point, of the sample can be selectively excited and their NMR response signals detected. The data collected from different regions or points the sample can be processed in a well-known manner to construct an image.

NMR imaging in the past has typically been performed in rather low magnetic fields and chemical shifts have not been a significant problem. In magnetic fields below about 0.7 T (Tesla), chemical shifts are difficult to observe because of the natural linewidths of the resonances and the low sensitivity of nuclei other than hydrogen ($^1H$). It is desirable, however, to perform NMR imaging in higher magnetic fields, in excess of 1 T for example, because of the improved signal-to-noise ratios realized; recent advances in magnet technology permit the use of higher magnetic fields, of the order of 1–1.5 T, in medical and biological NMR imaging. As the magnetic field increases, the chemical shift increases proportionately and becomes a greater problem. Chemical shift can produce the same effect as a spatial variation in the NMR signal. This results in chemical shift artifacts which are manifested, for example, as ghosts in two-dimensional-Fourier-transform (2DFT) imaging. Ghost artifacts may appear as a faint ring or ghost at one side of an image, and such ghosts both obliterate some of the spatial information present and reduce spatial resolution.

In proton imaging of the body, the chemical shift observed is principally between the hydrogens attached to oxygen in water and the hydrogens attached to carbon in $CH_2$ lipid (fat) tissue; this chemical shift is on the order of 3 ppm. The effect of the chemical shift is to produce two superimposed images; one image is the water image and the other image is the lipid image, which is shifted along the axis on which the projection was made by an amount corresponding to the chemical shift. At magnetic field strengths on the order of $B_o = 1.5$ T, for example, the chemical shift results in an artifact in the NMR image and is a significant problem.

It is desirable to provide NMR imaging methods that permit separation of superimposed chemically-shifted images, such as those of an aqueous proton image and a lipid proton image, into distinct images so as to remove chemical shift artifacts and improve the spatial resolution in the images. Separate resolved images are also desirable for other reasons. For example, an image constructed from lipid protons alone may be useful for looking at fat or atherosclerotic lesions or plaques in blood vessels, as well as for the evaluation of heart disease.

One approach which may be useful for separating the images is resolved-spectroscopy, which employs selective slice excitation, pulse gradient encoding in both x and y directions (to avoid blurring out the spectroscopic information by having a gradient on when the free induction decay (FID) is collected), and finally a Fourier transformation from the time domain to the frequency domain for each point of the imaging plane, i.e., at each pixel of the display. For an image array comprising N-by-N pixels, this approach requires $N^2$ projections. For example, a 256-by-256 array would require 65,536 projections to produce two resolved images. The amount of time required for this number of projections would be unreasonable, making a resolved-spectroscopy approach impractical.

BRIEF SUMMARY OF THE INVENTION

In accordance with the invention, a method of NMR imaging is provided that enables superimposed images, produced by chemically-shifted nuclei, to be resolved and separated into distinct chemical-shift artifact-free images having high spatial resolution. Two independent NMR images are formed as projections along first and second lines that extend in different directions. Each NMR image comprises first and second image components respectively produced by first and second chemically-shifted nuclei in the sampled region. The NMR images are registered by registering the first image components, for example, and are combined to eliminate the first image component and to produce a composite image containing the second image component.

Once a resolved image containing only the second image component has been obtained, the resolved image may then be combined with one (or both) of the NMR images to produce another resolved image containing only the first image component.

Stated somewhat differently, the data corresponding to NMR images taken along different projections are registered, combined and processed to produce a resolved image due to only one of a pair of chemically-shifted nuclei. In effect, the invention converts the problem of providing resolved images from each nuclei species to one of data processing, and for an N-by-N image array requires only 2N projections to produce two separate chemical-shift artifact-free images, which is smaller by a factor of N/2 from that required using resolved-spectroscopy techniques. Accordingly, a 256-by-256 image array requires only 512 projections, which represents a significant advantage in data collection time and data processing.

Accordingly, it is one object of the present invention to provide NMR imaging methods that enable superimposed chemically-shifted images to be separated and resolved into distinct high-spatial-resolution images that are free from chemical shift artifacts, while avoiding the disadvantages of approaches such as incurred with resolved-spectroscopy techniques.

This and other objects of the present invention will become apparent to those skilled in the art upon consideration of the following detailed description, when read in conjunction with the drawings.

BRIEF DESCRIPTION OF THE DRAWINGS

FIG. 1 illustrates diagrammatically an NMR sample situated in a static magnetic field and having a planar volume defined therein by selective excitation;

FIGS. 2a and 2b are 64 MHz proton ($^1H$) spectra from a human head and thigh, respectively, illustrating two chemically-shifted peaks, respectively corresponding to water and lipid proton response signals;

FIGS. 3a and 3b are diagrammatic views of NMR proton images of a human head taken, respectively, along orthogonal projections and illustrate chemically-shifted water and lipid images;

FIG. 4 is a diagrammatic view of a composite lipid image formed by registering and combining the images of FIGS. 3a and 3b to eliminate the water image; and FIG. 5 is a diagrammatic view illustrating the manner in which the data in each pixel of the composite image of FIG. 4 is processed to provide a resolved lipid image.

DETAILED DESCRIPTION OF THE PREFERRED EMBODIMENT

My invention is particularly well adapted for use with NMR proton imaging for resolving and separating water and lipid images to produce separate chemical shift artifact-free water and lipid images having high spatial resolution, and will be described in that environment. However, as will be appreciated, this is illustrative of only one utility of the invention.

Prior to describing the invention, it will be helpful to review briefly some of the basics of NMR imaging. FIG. 1 illustrates an NMR sample 10, which may be cylindrically shaped, for example. Sample 10 is positioned in a static homogeneous main magnetic field $B_o$ directed along the positive z-axis direction of a conventional Cartesian coordinate system, the z-axis being selected to be coincident with the axis 10a of the sample. The origin of the coordinate system may be taken to be the center of the sample, which is also the center of a thin planar slice or imaging volume 11 of the sample selected by selective irradiation of the sample in the presence of a magnetic field gradient along the z-axis. NMR imaging typically employs three gradients for exciting nuclei in selected regions of the sample and for spatially encoding the resulting NMR signals. These are:

$$G_x(t) = \partial B_o/\partial x \qquad (2)$$

$$G_y(t) = \partial B_o/\partial y \qquad (b\ 3)$$

$$G_z(t) = \partial B_o/\partial z \qquad (4)$$

The gradients $G_x$, $G_y$ and $G_z$ are generally functions of time t, and have associated magnetic fields $b_x$, $b_y$ and $b_z$, respectively, wherein $$b_x = G_x(t)x \qquad (5)$$

$$b_y = G_y(t)y \qquad (6)$$

$$b_z = G_z(t)z \qquad (7)$$

NMR images of selected planar slices 11 of the sample may be formed in a number of well-known ways using conventional NMR imaging apparatus for applying to the sample imaging sequences comprising RF magnetic field pulses directed orthogonal to the $B_o$ field (i.e. in the X-Y plane) and gradients for selectively exciting and detecting NMR signals from different portions of the sample. In two-dimensional-Fourier-transform (spin-wrap) imaging, for example, a 90° selective RF pulse is applied to the sample in the presence of a $G_z$ gradient to excite the nuclei in a selected imaging plane 11. Immediately thereafter, an inverted Gz gradient is applied to the sample 10 to rephase the nuclei; the inverted $G_z$ gradient is applied along with both an inverted, e.g., a negative, $G_x$ gradient to advance the position of the resulting NMR signal along the time axis away from the pulses, and a programmable $G_y$ gradient pulse to phase encode the nuclei in the y-axis direction. Thereafter, the NMR signals are collected in the presence of a $G_x$ gradient which spatially encodes the NMR signals according to their frequency in the x-axis direction. During subsequent imaging sequences, different values of the $G_y$ gradient are employed to give different projections along the x-axis, and a complete planar image is reconstructed by a two-dimensional Fourier transformation of the projections.

To illustrate the effects of chemical shift, data (NMR signals) collected with a projection on the x-axis have a frequency, $\omega$, obtained from the Fourier transformation of the free-induction-decay (FID) response, given by:

$$\omega = \gamma(1+\delta)(B_o + xG_x) \quad (8)$$

where $\gamma$ is the gyromagnetic ratio, $\delta$ is the difference in chemical shift between the water as the lipid proton species which dominate the usual in-vivo ($^1$H) spectra, and x is the spatial location along the x-axis. Equation 8 may be rewritten as:

$$\omega = \omega_o + \delta\gamma B_o + \gamma xG_x + \delta\gamma xG_x \quad (9)$$

where $\omega_o$ is the Larmor frequency given by $\gamma B_O$, $\gamma xG_x$ is the spatial encoding of x-direction spatial information into frequency information, and the last term is completely negligible. Equation 9 may be solved for spatial location as a function of $\omega$ to obtain:

$$x = (\omega - \omega_o - \delta\omega_o)/(\gamma G_x) \quad (10)$$

Equation 10 indicates that a chemical shift results in a misassignment of the shifted resonant frequency to a nearby spatial location, differing from the "expected" location by:

$$\Delta_x = -\delta\omega_o/\gamma G_x \quad (11)$$

thereby producing an artifact in the NMR image. In the pulse gradient encoding Y-direction, the chemical shift is negligible and produces no noticeable effects.

FIGS. 2a and 2b illustrate 64 MHz proton spectra 14 and 16 recorded from a human head and thigh, respectively, in a magnetic field of 1.5 T. The two peaks 14a and 14b or 16a and 16b of each spectra correspond to water and lipid protons, respectively, and the figures show that the chemical shift between the water peaks 14a and 16a and the lipid peaks 14b or 16b is on the order of 3.5 ppm, or about 220 Hz. at a 64 MHz. center frequency. The relative intensities of the water and lipid peaks vary with the tissue studied and with the individual. There is not much fat in the brain, except around the surface, which is why the lipid peak 14b in the head response 14 (FIG. 2a) is smaller than the lipid peak 16b in the response 16 (FIG. 2b) for the thigh. While the lipid in the nerve sheath in the brain apparently has too short a relaxation time to be observed in typical in-vivo measurement, the lipid peak 14a in the head response 14 is still, however, sufficient to generate a ghost artifact at the periphery of an NMR head image, which serves to obliterate some of the spatial information present.

FIGS. 3a and 3b illustrate diagrammatically the effects of chemical shift artifacts on NMR images. FIG. 3a represents a spin-warp image 18 of a cross section through a human head formed from projections on the x-axis, by spatial-frequency-encoding in the x-axis direction and pulse-gradient (phase) encoding in the y-axis direction. As shown, the NMR image comprises two superimposed images or image components 20 and 22 that are offset from one another. The solid line image 20 in the Figure represents a water proton image, and the dotted line image 22 represents a lipid proton image that is offset from the water image 20 by the amount of the chemical shift between the water and lipid protons. As shown, and as indicated in equation 10, the chemical shift causes the images 20 and 22 to be offset in the direction of the axis along which the projections were made, i.e., the x-axis. The lipid image 22 constitutes a chemical shift artifact, and in an actual NMR image 18 would appear as a shadow or a ghost at the periphery of the water image 20. The intensity of the lipid image 22 is, of course, related to the density of the lipid protons in the imaging plane and, in general, would be greater for an NMR image of a thigh than for an NMR image of a head, as illustrated e.g. by the relative intensities of the water and lipid peaks in FIGS. 2a and 2b.

FIG. 3b illustrates diagrammatically an NMR image 18' of the same cross section of the head as FIG. 3a, except that image 18' is formed from projections on the y-axis, by spatial-frequency-encoding in the y-axis direction and pulse-gradient (phase) encoding in the x-axis direction. As shown in FIG. 3b, the water image 20' and lipid image 22' are offset in the y-axis direction, along the axis on which the projections were taken.

The invention affords an NMR imaging method that takes advantage of the chemical shift artifact to enable the water images 20 and 20' and lipid images 22 and 22' to be separated from one another into two distinct artifact-free images having high spatial resolution. This is accomplished by forming two independent NMR images of the same imaging plane using different projection directions i.e., along lines that extend in different directions. The NMR images may be formed using conventional NMR imaging apparatus and are preferably formed using two-dimensional-Fourier-transform (spin warp) imaging methods, and any of the well-known 2DFT imaging sequences may be employed for this purpose. Preferably, the projection directions are orthogonal, along the x- and y-axis, for example, since, as will be described hereinafter, this simplifies the data processing and affords the maximum degree of independence between the two images. For an N-by-N image array comprising $N^2$ pixels, the two images require only 2N projections. For example, a 256-by-256 array requires only 512 projections to form the two images.

As noted above, each of the two NMR images 18 and 18' will comprise two image components, a water component 20 or 20' and a lipid component 22 or 22', that are offset from one another along the axis on which the projections are taken by the amount of the chemical shift. If the two NMR images are designated $I_x$ and $I_y$, where the subscript indicates the axis along which the projections were taken, the water and lipid components will be offset along the x-axis for the $I_x$ image 18 and along the y-axis for the $I_y$ image 18'. The two independent images $I_x$ and $I_y$, each containing the same two water and lipid components, may be combined, as described hereinbelow, to form a composite image in which one of the components is eliminated, and the composite image may be processed to produce a resolved image containing only the other component. Once a resolved image of one of the components is obtained, it may be combined with either of the $I_x$ or $I_y$ images (or with both and the results averaged) to obtain a resolved image of the other component. The process is somewhat analogous to solving two independent simultaneous equations in two unknowns.

To separate the water and lipid components, the $I_x$ image 18' and $I_y$ image 18a' are first spatially registered such that one of the components, for example the water component images 20 and 20', of each of the two images are in registration. To assist in spatially registering the images, it is desirable to include reference points 25 for each component in each of the images. This may be accomplished by imaging with small reference samples of each of the components adjacent to the subject sample. For example, a plurality of water bottles 25a and a plurality of lipid bottles 25b may be disposed adjacent to the subject sample so as to appear as reference points in the $I_x$ and $I_y$ images, as illustrated in FIGS. 3a and 3b. As shown, four water bottles may be employed so as to afford four water reference points 25a that appear as small circles adjacent to the four corners of the images, and two lipid bottles may be employed to provide two lipid reference points 25b (FIG. 3a) and 25b' (FIG. 3b) adjacent to two sides of the images. To register the water components of the two images, their water reference points 25a are aligned. Similarly, to register the lipid components, the lipid reference points 25b and 25b' are aligned. In addition to assisting in registering the two images, the reference points are also desirable for enabling the absolute intensities of the registered components of the two images to be adjusted to be the same so that when the two registered images are combined by subtracting one from the other, the registered component will be eliminated.

After registering a particular component of the two images, the images 18 and 18' may be subtracted as indicated above to eliminate that component. This results in a composite image which is either totally aqueous or totally lipid. However, it contains the desired component plus a negative ghost of the desired component offset in both the x- and y-directions by the amount of the chemical shift. FIG. 4 illustrates diagrammatically a composite image 30 containing offset lipid image components 32 and 32' produced by registering the water component of the $I_x$ and $I_y$ images 18 and 18' of FIGS. 3a and 3b, and subtracting $I_y$ from $I_x$. The elimination of such a single ghost offset by a known amount in a given direction is a rather straightforward signal processing task, and the composite image 30 of FIG. 4 may be processed in the following manner to form a resolved lipid image.

If $S_{ij} = (I_x - I_y)_{ij}$ is the value in pixel ij of the subtracted images, where i and j are integers, and if $L_{ij}$ is the desired, i.e., resolved, image value, then $$S_{ij} = L_{ij} - L_{i-\delta x, j-\delta y} \qquad (11)$$

and $$L_{ij} = S_{ij} + L_{i-\delta x, j-\delta y} \qquad (12)$$

where $\delta x$ and $\delta y$ are the chemical shift measured in pixels of the images in the x and y directions, and $(-L_{i-\delta x, j-\delta y})$ represents the negative offset ghost. The signs of $\delta x$ and $\delta y$ will depend, of course, on the relative positions of the subtracted $I_x$ and $I_y$ images, and it is a relatively simple manner to adjust the gradients of the NMR imaging apparatus such that the chemical shift in each x and y direction corresponds to an integral number of pixels. For the signs used in equations 11 and 12, the negative ghost is assumed to be shifted down and to the right (as shown by the $I_y$ (lipid) image 32' or the lipid samples 34', with respect to samples 34, in FIG. 4) so that the resolved image can be calculated by progressing down through the composite image from left to right in the Figure, one row at a time. Accordingly, $L = 0$ if either of its indexes, i.e., subscripts, is negative.

FIG. 5 illustrates diagrammatically the application of the foregoing process to the composite image of FIG. 4 to produce a resolved lipid image. For each of illustration, the image array 40 is assumed to comprise an array of 6-by-6 pixels, although in practice much larger pixel arrays, 256-by-256, for example, are employed, and the chemical shift, $\delta$, is assumed to be exactly one pixel in each direction x and y although exact integer pixel shifts are neither generally encountered nor necessary for the resolution process. This illustrative example corresponds to the $I_x$ image 32 and the $I_y$ image 32' of FIG. 4 being offset at 45° from one another, with the negative ghost $I_y$ (lipid) image 32" being shifted downward and to the right relative to the $I_x$ (lipid) image 32. The $I_x$ and $I_y$ lipid reference points 34 and 34' for the two images clearly show this offset in FIG. 4.

Referring to FIG. 5, and with the foregoing assumptions, it is seen that the composite image of FIG. 4 may be represented as an $I_x$ pixel array 32a and a $-I_y$ pixel array 32" a shifted downward and to the right by one pixel. A resolved $I_x$ lipid image may be obtained by eliminating the negative offset ghost $(-I_y)$ image from the composite image by the process defined by equation 12.

As shown in FIG. 5, the pixels in the first row, i = 1, and in the first column, j = 1, contain only values of the lipid image $I_x$. Accordingly, the values in these pixels may be taken directly as the values in the corresponding pixels of the resolved $I_x$ image. However, the remaining pixels ij of the composite image each contain (as shown by equation 11) the desired value $L_{ij}$ of the resolved $(I_x)$ image and a negative offset ghost value $L_{i-1, j-1}$. From equation 12, and as shown in FIG. 5, the desired value $L_{22}$ of pixel 2,2 of the resolved image is equal to the composite value $S_{22}$ in pixel 2,2 of the composite image plus the value $L_{11}$ *in pixel 1,1 of the resolved image. Similarly, the value $L_{33}$* in pixel 3,3 of the resolved image is equal to the value $S_{33}$ in that pixel of the composite image plus the value $L_{22}$ in pixel 2,2 of the resolved image. Accordingly, the value in each of the pixels in row i = 2, columns j = 2 through 6 of the resolved image may be determined by adding to the composite image value in each pixel the resolved image value from the pixel in the first row that is at 45° to the left of the pixel, as indicated in FIG. 5. This process, which is in effects a deconvolution process, may be iterated for each pixel, processing down through the image from left to right, one row at a time, until the $I_x$ lipid image is completely resolved.

Once a resolved lipid image is obtained, a resolved water image may be obtained by subtracting the resolved lipid image, properly offset, from either $I_x$ or $I_y$, or alternatively from both and averaging the results. If only a water image is desired, the foregoing process could, of course, be performed by registering the lipid components of the $I_x$ and $I_y$ images and subtracting and deconvolving the composite water image to produce a resolved water image directly.

Although the foregoing process has been described in the context of registering, subtracting and deconvolving "images", in actual practice NMR images are constructed by processing (in a well-known manner) the NMR signals received from a sample in the computer of the NMR imaging system to produce arrays of numbers that represent the intensity of the NMR image at each pixel in the NMR display. Accordingly, the registering, subtracting and deconvolving process of the invention may be implemented as a rather straightforward data-processing routine by a computer program that operates on the arrays of numbers that represent the intensities of the NMR images in each pixel. By adjusting the chemical shift to be an integral number of pixels, as described, for example, in connection with FIG. 5, it will be appreciated that the computer program required to implement the process becomes quite simple. If the chemical shift does not constitute an integral number of pixels, it merely becomes necessary to employ an interpolation process for deriving the required values for the pixels of the resolved image. The deconvolution process may also be implemented in hardware as a recursive filter.

As noted earlier, the method of the invention may be analogized to solving two simultaneous equations in two unknowns. In order to resolve and separate two independent image components from an image, it is necessary to have two independent NMR images containing such components. The images may be produced by any of a variety of conventional NMR imaging sequences that enable independent images to be constructed from projections onto different lines, and, as noted above, it is preferable that the projection directions be orthogonal. Independent images cannot be constructed from projections onto the same line using inverted gradients, for example, since this merely produces two mirror images which are not independent. Two-dimensional-Fourier-transform (2DFT) imaging techniques conveniently allow independent images to be constructed from projections onto different lines. In constructing the images, it is desirable to interleave the projections by first taking a projection in one direction and then a projection in the other direction so as to minimize problems due to patient motion and machine instability.

From the foregoing, it will be appreciated that the invention provides methods of NMR imaging that conveniently enable images due to chemically-shifted nuclei to be separated and resolved so as to afford artifact-free image having high spatial resolution. It can now be seen that the method can be extended to species with more than two dominant peaks by iteration. Furthermore, while a preferred embodiment of the invention has been shown and described, it will be appreciated by those skilled in the art that many modifications and variations may be made in this embodiment without departing from the principles and the spirit of the invention, the scope of which is defined by the appending claims.

What I claim is:

1. A method for obtaining a high-spatial-resolution NMR image of a sample containing first and second chemically-shifted nuclei, the method comprising the steps of:
   (a) forming a first NMR image of a selected region of the sample from projections along a line extending in a first direction;
   (b) forming a second NMR image of the selected region from projections along a second line extending in a second direction;
   (c) selecting the second direction to be different from the first direction and to cause the first and second NMR images to each comprise a first image component produced by the first nuclei and a second image component produced by the second nuclei and with the second image component offset from the first image component by the chemical shift between the first and second nuclei;
   (d) registering the first image components of the first and second NMR images;
   (e) combining the first and second registered NMR images by subtracting the registered first image components of the first and second NMR images to substantially eliminate the first image components and to produce a composite image comprised substantially only of second image components; and
   (f) processing the composite image by adding the value of a first portion of the composite image, which first portion does not have any part thereof representative of the second image component of the second NMR image, to the value of another portion of the composite image, adjacent to the first portion, that does have a part thereof representative of the second image component of the first NMR image, to produce a resolved image containing substantially only the second image component of the first NMR image.

2. The method of claim 1, further comprising the step of: adjusting the amplitudes of the first image components of the first and second NMR images to be the same prior to carrying out the subtracting step (e).

3. The method of claim 1, wherein the subtracting step includes the steps of: superimposing the negative of the second image component of the second NMR image upon the second image component of the first NMR image; and offsetting the negative second image component of the second NMR images from the second image component of the first NMR image by the chemical shift in the first and second directions to obtain the composite image.

4. The method of claim 3, wherein each image comprises an array of elements, and wherein said processing step (f) comprises the step of: eliminating the negative second image component from the composite image to produce the resolved image by adding elements of the second image component of the first NMR image to elements of the composite image that are offset therefrom by the amount of the chemical shift.

5. The method of claim 4, wherein the array of elements comprises an array of pixels, each pixel corresponding to a distinct portion of the image and having an associated pixel value that defines the intensity of the image in such portion, and wherein the adding and subtracting steps respectively comprise the steps of adding and subtracting pixel values.

6. The method of claim 5, further comprising the step of: adjusting the offset value and pixel size to cause the chemical shift to substantially correspond to an integral number of pixels.

7. The method of claim 6, wherein said processing step (f) comprises the step of: selecting as resolved pixel values for a first row and a first column of pixels of the resolved image respective pixel values of a first row and a first column of the composite image that correspond to only the second image component of the first NMR image; determining pixel values for a second row and a second column of the resolved image by adding the resolved pixel value for each pixel of the first row and the first column to the pixel value of a pixel of the second row of the composite image; and thereafter determining the pixel values of the remaining pixels of the resolved image by adding the pixel value of each pixel of a resolved row to the pixel value of a pixel in a subsequent row.

8. The method of claim 1, further comprising the step of: subtracting the resolved image, offset by the amount of the chemical shift, from one of the first and second NMR images to produce another resolved NMR image containing only a first image component.

9. The method of claim 1, further comprising the step of: selecting the first and second directions to be substantially orthogonal to one another.

10. The method of claim 1, further comprising the step of: providing first and second pluralities of reference points corresponding, respectively, to the first and second nuclei in the first and second NMR images; and wherein the registering step (d) includes the step of: registering at least one of the pluralities of reference points in each image.

11. The method of claim 1, wherein the image-forming steps (a) and (b) each comprise the step of: forming the associated one of the first and second NMR images using a two-dimensional-Fourier-transform imaging technique.

12. A method for obtaining a high-spatial-resolution NMR image of a sample containing first and second chemically-shifted nuclei, the method comprising the steps of:
  (a) forming first and second independent NMR images of a selected region of the sample, said first and second NMR images each comprising an array of pixels each having an associated value representative of the intensity of the image in that pixel, each of said first and second NMR images having a first image component produced by the first nuclei and a second image component, offset from the first image component, produced by the second nuclei;
  (b) registering the first image components of the first and second NMR images;
  (c) combining the registered first and second NMR images by subtracting each pixel value of the second NMR image from a corresponding pixel value of the first NMR image to eliminate the first image components and to produce a composite image containing the second image components of each of the first and second NMR images superimposed upon, and offset from, one another; and
  (d) deconvolving the value of each pixel of the composite image to produce a resolved image containing substantially only the second image component of the first NMR image.

13. The method of claim 12, wherein the image forming step (a) comprises the step of: forming the first and second NMR images with first and second pluralities of reference points corresponding, respectively, to the first and second nuclei; and wherein the subtracting step comprises the step of: subtracting pixel values to cause pixel values of the second NMR image corresponding to the first plurality of reference points to be subtracted from pixel values of the first NMR image corresponding to the first plurality of reference points.

14. The method of claim 12, wherein the image forming step (a) comprises the step of: forming the first and second NMR images with the offset substantially corresponding to an integral number of pixels.

15. The method of claim 14, wherein the processing step (d) comprises the step of: adding pixel values of the composite image that do not have a portion representative of the negative of the second component to pixel values of the composite image that do have a portion representative of the negative of the second component, to eliminate from such pixel values the portion representative of the negative of the second component.

16. The method of claim 15, wherein the composite image has a first row and a first column of pixels having pixel values corresponding to only the second image component of the first NMR image, and wherein the processing step (d) further comprises the steps of: adding each such pixel value to a pixel value associated with a predetermined pixel of the composite image that is offset by substantially integral number of pixels to produce a resolved pixel value for the predetermined pixel; and thereafter adding the resolved pixel values to the pixel values of other pixels of the composite image that are offset by the substantially integral number of pixels to produce other resolved pixel values.

17. The method of claim 12, further comprising the step of: subtracting the resolved image, offset by the amount of the chemical shift, from one of the first or second NMR images to produce another resolved NMR image of the first image component.

18. The method of claim 12, further comprising the steps of: subtracting the resolved image, offset by the amount of the chemical shift, from each of the first and second NMR images; and averaging the results to produce another resolved NMR image of the first image component.

19. The method of claim 12, further comprising the step of: forming the first and second NMR images using substantially orthogonal projection directions.

20. The method of claim 12, wherein the first nuclei comprise water nuclei and the second nuclei comprise lipid nuclei.

* * * * *